(12) United States Patent
Yoshikawa et al.

(10) Patent No.: US 10,998,456 B2
(45) Date of Patent: May 4, 2021

(54) SOLAR CELL, METHOD FOR MANUFACTURING SAME AND SOLAR CELL MODULE

(71) Applicant: KANEKA CORPORATION, Osaka (JP)

(72) Inventors: Kunta Yoshikawa, Settsu (JP); Daisuke Adachi, Settsu (JP); Toru Terashita, Settsu (JP); Masafumi Hiraishi, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/731,434

(22) Filed: Dec. 31, 2019

(65) Prior Publication Data
US 2020/0135943 A1 Apr. 30, 2020

Related U.S. Application Data

(63) Continuation of application No. 15/542,204, filed as application No. PCT/JP2016/050406 on Jan. 7, 2016, now Pat. No. 10,566,470.

(30) Foreign Application Priority Data

Jan. 7, 2015 (JP) .................................. 2015-001329

(51) Int. Cl.
*H01L 31/0216* (2014.01)
*H01L 31/0747* (2012.01)
(Continued)

(52) U.S. Cl.
CPC .................. *H01L 31/02168* (2013.01); *H01L 31/022425* (2013.01); *H01L 31/022433* (2013.01);
(Continued)

(58) Field of Classification Search
CPC . H01L 31/022425; H01L 31/186–1872; H01L 31/0684; H01L 31/208; H01L 31/022433; H01L 31/048–049
See application file for complete search history.

(56) References Cited

U.S. PATENT DOCUMENTS 5,582,653 A 12/1996 Kataoka et al.
6,294,724 B1 9/2001 Sasaoka et al.
(Continued)

FOREIGN PATENT DOCUMENTS

CN 104854708 A 8/2015
JP 2008-135655 A 6/2008
(Continued)

OTHER PUBLICATIONS

International Search Report dated Mar. 22, 2016 for PCT/JP2016/050406.
(Continued)

*Primary Examiner* — Eric R Smith
(74) *Attorney, Agent, or Firm* — Hauptman Ham, LLP

(57) ABSTRACT

The solar cell includes a plurality of light-receiving-side finger electrodes on a light-receiving surface of a photoelectric conversion section having a semiconductor junction. The light-receiving surface of the photoelectric conversion section is covered with a first insulating layer. Each light-receiving-side finger electrodes include: a first metal seed layer provided between the photoelectric conversion section and the first insulating layer; and a first plating metal layer being conduction with the first metal seed layer through openings formed in the first insulating layer. The solar cell includes an isolated plating metal layer pieces contacting neither the light-receiving-side finger electrodes nor the back-side finger electrodes. On the surface of the first insulating layer, an isolated plating metal crowded region is present in a form of a band-shape extending parallel to an
(Continued)

extending direction of the light-receiving-side finger electrodes.

10 Claims, 5 Drawing Sheets

(51) Int. Cl.
*H01L 31/0224* (2006.01)
*H01L 31/054* (2014.01)

(52) U.S. Cl.
CPC ...... *H01L 31/0543* (2014.12); *H01L 31/0747* (2013.01); *H01L 31/02164* (2013.01); *H01L 31/022466* (2013.01); *Y02E 10/52* (2013.01)

(56) References Cited

U.S. PATENT DOCUMENTS

| | | | |
|---|---|---|---|
| 2011/0146765 A1* | 6/2011 | Ahn | H01L 31/022425 136/252 |
| 2011/0197959 A1 | 8/2011 | Catchpole et al. | |
| 2012/0240998 A1 | 9/2012 | Ballif | |
| 2013/0306129 A1 | 11/2013 | Tohoda et al. | |
| 2013/0312827 A1 | 11/2013 | Adachi et al. | |
| 2014/0182675 A1 | 7/2014 | Tokuoka et al. | |
| 2014/0190563 A1 | 7/2014 | Tokuoka | |
| 2015/0090334 A1 | 4/2015 | Han et al. | |
| 2016/0126399 A1 | 5/2016 | Hino et al. | |
| 2016/0204287 A1 | 7/2016 | Bettinelli et al. | |

FOREIGN PATENT DOCUMENTS

| | | |
|---|---|---|
| JP | 2009-290234 A | 12/2009 |
| JP | 2012-19138 A | 1/2012 |
| JP | 5695283 B1 | 4/2015 |
| WO | 2012/029847 A1 | 3/2012 |
| WO | 2013/077038 A1 | 5/2013 |
| WO | 2014/185537 A1 | 11/2014 |
| WO | 2015/032806 A1 | 3/2015 |

OTHER PUBLICATIONS

International Preliminary Report on Patentability dated Jul. 11, 2017 for PCT/JP2016/050406.

\* cited by examiner

SOLAR CELL, METHOD FOR MANUFACTURING SAME AND SOLAR CELL MODULE

CROSS REFERENCE TO RELATED APPLICATION

This application is a Continuation of U.S. patent application Ser. No. 15/542,204, filed Jul. 7, 2017, which is the National Stage of International Application number PCT/JP2016/050406 filed on Jan. 7, 2016 which is based upon and claims the benefit of priority to Japanese Patent Application No. 2015-001329 filed on Jan. 7, 2015 in the JPO (Japanese Patent Office). The disclosures of the above-listed applications are hereby incorporated by reference herein in their entirety.

TECHNICAL FIELD

The invention relates to solar cell, manufacturing method thereof and solar cell module.

BACKGROUND ART

In a solar cell, carriers (electrons and holes) generated by light irradiation to a photoelectric conversion section composed of a semiconductor junction are extracted to an external circuit to generate electricity. Metal electrodes are provided on front surface and back surface of the photoelectric conversion section of the solar cell for efficiently extracting carriers generated at the photoelectric conversion section to the external circuit. For example, in a heterojunction solar cell in which a silicon-based thin-film is provided on a surface of a conductive single-crystalline silicon substrate to form a semiconductor junction, transparent electrode made of a transparent electroconductive oxide or the like is provided on a silicon-based thin-films on each of a light-receiving side and a back side, and metal collecting electrodes are provided on the transparent electrodes to collect photocarriers generated in the crystalline silicon substrate.

Light that is irradiated on regions where the metal collecting electrodes are formed is reflected on or absorbed by the metal collecting electrodes to cause shadowing loss. In order to reduce the shadowing loss, the collecting electrode on the light-receiving side is formed in a pattern shape. A typical example of the pattern of the collecting electrode is a grid pattern composed of finger electrodes and bus bar electrodes. The collecting electrode on the back side may be disposed on the entire surface of the back surface, or may be a pattern shape. In a solar cell module installed in such a manner that light enters into the module from back side as well as from front side, e.g, a flat roof type and on-ground installation type solar cell module, a patterned collecting electrode is provided on the back side of the solar cell. Also in a solar cell module having a structure in which light incident to an interspace between adjacent two cells is reflected on a back sheet, a patterned collecting electrode is provided on the back side of the solar cell.

The patterned collecting electrode is generally formed by screen printing of an electroconductive paste such as silver paste. The collecting electrode formed by using silver paste contains a resin material, so that it is high in resistivity and high in material costs. Methods for forming metal collecting electrodes by plating are proposed for reduction of the electrode material costs and the like. The plating method makes it possible to form a metal electrode large in thickness and low in resistance, so that the line width of the metal electrode is made smaller than the method using the electroconductive paste. Accordingly, formation of the metal collecting electrode by the plating method also has an advantage of improving the light collection efficiency of the resultant solar cell by decreasing a shadowing loss.

A method of forming a collecting electrode having a predetermined pattern by plating is known. In such a method, an insulating layer having openings is formed on a surface of a photoelectric conversion section and a metal is deposited on the surface of the photoelectric conversion section in areas where the openings are formed in the insulating layer. For example, Patent Document 1 discloses a method of forming an insulating layer having a thickness of about 10 to 15 µm on a transparent electrode of a photoelectric conversion section, making openings in the insulating layer, and then forming a collecting electrode by electroplating.

Patent Documents 2 and 3 propose a method of forming crack-like openings in an insulating layer deposited on the metal seed layer. In this method, a metal seed layer is formed by printing an electroconductive paste containing a low-melting-point material, and an insulating layer is formed thereon, followed by heating for annealing so that the low-melting-point material in the metal seed layer is thermally fluidized. This method is excellent from the viewpoint of material costs and process costs, since the method makes it possible to form openings selectively in the metal seed layer-formed region of the insulating layer, and thus any patterning of the insulating layer, such as using a resist and the like, is unnecessary.

PRIOR ART DOCUMENT

Patent Documents

Patent Document 1: International Publication No. WO 2012/029847
Patent Document 2: International Publication No. WO 2013/077038
Patent Document 3: International Publication No. WO 2014/185537

SUMMARY OF THE INVENTION

Problems to be Solved by the Invention

As described above, by forming a metal collecting electrode by a plating method, the resultant solar cell may have decreased electrode formation area thereby reducing shadowing loss. However, when the electrode interval between adjacent two finger electrodes is widened to decrease the electrode formation area, the carrier collecting efficiency of the solar cell tends to decline, and a fill factor of the solar cell tends to be lowered. Thus, the pattern shape of the electrodes is determined by considering the balance between the shadowing loss and the carrier collecting efficiency. Regarding a collecting electrode on the light-receiving side, the interval between adjacent two finger electrodes is set so that the total area of the finger electrodes is within the range of about 1 to 3% of the whole of the light-receiving surface area. In order to further improve the conversion efficiency of the solar cell, it is desired that while the electrode formation area is maintained, the shadowing loss is decreased to improve light-capturing efficiency.

Means for Solving the Problems

The inventors have found that by depositing a plating metal having a small area on a collecting electrode-nonformed region on a light-receiving side of a solar cell, the light capturing efficiency is improved despite an increase in light shielding area by the metal.

The solar cell of the present invention includes a photoelectric conversion section having a semiconductor junction, a plurality of light-receiving-side finger electrodes provided on a light-receiving surface of the photoelectric conversion section, and a plurality of back-side finger electrodes provided on a back surface of the photoelectric conversion section. It is preferred that a separation distance between the adjacent two light-receiving-side finger electrodes is larger than a separation distance between the adjacent two back-side finger electrodes.

The light-receiving surface of the photoelectric conversion section is covered with a first insulating layer. The light-receiving-side finger electrodes each include a first metal seed layer and a first plating metal layer. The first metal seed layer is provided between the photoelectric conversion section and the first insulating layer. The first plating metal layer is in conduction with the first metal seed layer through openings formed in the first insulating layer.

The solar cell of the present invention has isolated plating metal layer pieces that contact neither the light-receiving-side finger electrodes nor the back-side finger electrodes. On a surface of the first insulating layer, an isolated plating metal crowded region is present in a form of a band-shape extending parallel to an extending direction of the light-receiving-side finger electrodes. An area density of the isolated plating metal layer pieces in the isolated plating metal crowded region is two or more times an average area density in a whole of a region where the light-receiving-side finger electrodes are not formed. It is preferred the isolated plating metal crowded region is located 20 μm or more apart from the light-receiving-side finger electrodes.

It is preferred that the back surface of the photoelectric conversion section is covered with a second insulating layer, and that the back-side finger electrodes each include a second metal seed layer and a second plating metal layer. The second metal seed layer is provided between the photoelectric conversion section and the second insulating layer. The second metal seed layer is in conduction with the second plating metal layer through openings formed in the second insulating layer. In this configuration, it is preferred that the isolated plating metal layer pieces deposited on a surface of the first insulating layer are larger in area density than the isolated plating metal layer pieces deposited on a surface of the second insulating layer.

Each of the first insulating layer and the second insulating layer is preferably an inorganic layer. The first insulating layer and the second insulating layer each preferably have a thickness of 10 to 200 nm. The first plating metal layer, the second plating metal layer and the isolated plating metal layer pieces each preferably contain copper.

The finger electrodes of the solar cell of the present invention can be produced by forming plating metal layers on a metal seed by a plating method through openings formed in the respective insulating layers deposited on the metal seed. When an electroconductive paste is printed to form a metal seed layer, solvent may ooze out from an electroconductive paste printed region. In this case, isolated plating metal layer pieces are easily formed on the insulating layer near the outer edge of a region where the solvent has oozed. Therefore, the isolated plating metal crowded region is formed in a band-shape extending parallel to the finger-electrode extending direction.

The present invention further relates to a solar cell module including solar cells as described above. The solar cell module of the present invention includes a light-receiving-side protecting member disposed on the light-receiving side of the solar cells, and a back-side protecting member disposed on the back side of the solar cell. Encapsulants are provided between the solar cell and the light-receiving-side protecting member and between the solar cell and the back-side protecting member.

The light-receiving-side protecting member is transparent, and is preferably made of glass. The back-side protecting member may be either transparent or opaque. The back-side protecting member preferably includes no metal foil. The encapsulant provided between the solar cell and the back-side protecting member preferably includes a polyolefin resin.

Effects of the Invention

In the solar cell of the present invention, light reflected on the finger electrodes on the light-receiving side can be scattered on the isolated plating metal layer pieces to enter into the photoelectric conversion section. Thus, the solar cell is excellent in light collection efficiency.

MODE FOR CARRYING OUT THE INVENTION

Figure 1:
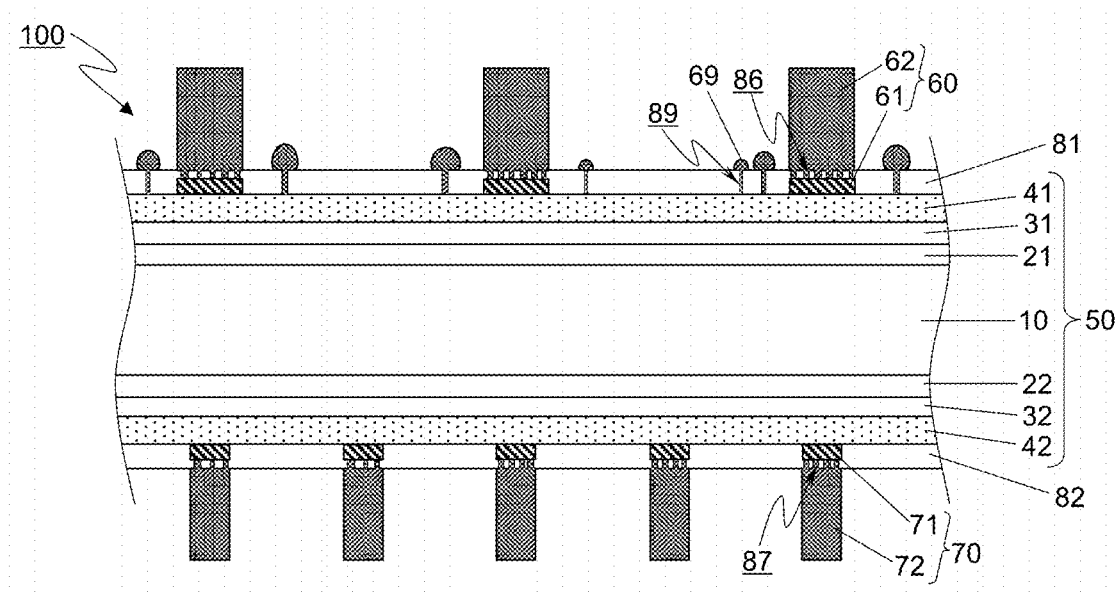
FIG. 1 is a schematic sectional view of a solar cell of an embodiment.

FIG. 1 is a schematic sectional view of a heterojunction solar cell according to an embodiment of the present invention. As schematically illustrated in FIG. 1, the solar cell of the invention includes, on a light-receiving side of a photoelectric conversion section 50, a plurality of light-receiving-side finger electrodes 60, and includes, on a back side of the photoelectric conversion section 50, a plurality of back-side finger electrodes 70. The light-receiving-side finger electrodes 60 each include a metal seed layer 61 and a plating metal layer 62 in this order from the photoelectric conversion section 50.

Hereinafter, the present invention will be described more detail by showing an example of the above-mentioned heterojunction solar cell. A heterojunction solar cell is a crystalline silicon solar cell in which a semiconductor junction is produced by providing a silicon-based thin-film on a surface of a conductive single-crystalline silicon substrate, the silicon-based thin-film having a bandgap different from that of the single-crystalline silicon. It is known that surface defects of the conductive single-crystalline silicon substrate 10 are terminated and thus conversion efficiency is improved, when intrinsic silicon-based thin-films 21 and 22 are interposed between conductive silicon-based thin-films 31 and 32 for producing diffusion potential and a conductive single-crystalline silicon substrate 10, respectively.

[Photoelectric Conversion Section Structure]

(Silicon Substrate)

The conductive single-crystalline silicon substrate 10 may be an n-type single-crystalline silicon substrate or a p-type single-crystalline silicon substrate. An n-type single-crystalline silicon substrate is preferred because of a long carrier life time in the silicon substrate.

(Silicon-Based Thin-Film)

The silicon-based thin-film 31 of first conductivity-type is formed on a first principal surface (on the light-receiving side) of the conductive single-crystalline silicon substrate 10, and the silicon-based thin-film of second conductivity-type is formed on a second principal surface (on the back side) of the conductive single-crystalline silicon substrate 10. The silicon-based thin-film 31 of first conductivity-type and the silicon-based thin-film 32 of second conductivity-type have different conductivity-types. One of these conductivity-types is a p-type while the other is an n-type. These conductive silicon-based thin-films 31 and 32 may be a p-type silicon-based thin-film and an n-type silicon-based thin-film. The thickness of each of the conductive silicon-based thin-films is preferably 20 nm or less, more preferably 15 nm or less. The thickness of the conductive silicon-based thin-film is preferably to 2 nm or more to keep appropriate film coverage.

Out of the conductive silicon-based thin-films 31 and 32, a silicon layer different in conductivity-type from the conductive single-crystalline silicon substrate 10 is called an "emitter layer". The following structure is called a "front emitter structure" in which the conductive single-crystalline silicon substrate 10 and the silicon-based thin-film 31 of first conductivity-type formed on the light-receiving side have opposite conductivity-types, and the conductive single-crystalline silicon substrate 10 and the silicon-based thin-film 32 of second conductivity-type formed on the back side of the solar cell have the same conductivity-type. For example, in a heterojunction solar cell having a "front emitter structure" in which the conductive single-crystalline silicon substrate 10 is an n-type single-crystalline silicon substrate, a p-type silicon-based thin-film which becomes an emitter layer is arranged on the light-receiving side, and an n-type silicon-based thin-film is arranged on the back side. The following structure is called a "back emitter structure": a structure in which the conductive single-crystalline silicon substrate 10 and the silicon-based thin-film 31 of first conductivity-type have the same conductivity-type, and the conductive single-crystalline silicon substrate 10 and the silicon-based thin-film 32 of second conductivity-type have opposite conductivity types.

Each of the conductive silicon-based thin-films 31 and 32 is preferably made of amorphous silicon. A dopant impurity is preferably P (phosphorus) for an n-type silicon layer, and is preferably B (boron) for the p-type silicon layer.

It is preferred that the intrinsic silicon-based thin-film 21 is provided between the silicon substrate 10 and the silicon-based thin-film 31 of first conductivity-type, and the intrinsic silicon-based thin-film 22 is provided between the silicon substrate 10 and the silicon-based thin-film 32 of second conductivity-type. When the intrinsic silicon-based thin-films 21 and 22 are formed on the respective surfaces of the conductive single-crystalline silicon substrate 10, surface defects of the silicon substrate 10 are terminated so that the lifetime of carriers is elongated to improve output power of the solar cell.

The method for forming each of the silicon-based thin-films is not particularly limited, and is preferably a CVD (chemical vapor deposition) method since the method can attain a precise thickness control. A raw-material gas used for the CVD may be a silicon-based gas such as $SiH_4$, or may be a mixed gas of a silicon-containing gas and $H_2$. In order to improve the silicon-based thin-film in optical transparency and the like, a small amount of raw material gas containing, oxygen, carbon or the like may be added to the silicon-based gas. A dopant gas used to form the conductive silicon-based thin-film is, for example, $B_2H_6$ or $PH_3$.

(Transparent Electrode Layer)

The photoelectric conversion section 50 of the heterojunction solar cell includes transparent electrode layers 41 and 42 on the conductive silicon-based thin-films 31 and 32, respectively. The raw material of the transparent electrode layers 41 and 42 may be generally a transparent conductive metal oxide such as indium oxide, tin oxide, zinc oxide, titanium oxide, or a complex oxide of two or more of such oxides. In particular, an indium-based complex oxide made mainly of indium oxide is preferred from the viewpoint of achieving both high electroconductivity and transparency. A dope impurity for the indium-based complex oxide may be a metal such as Sn, Ti, W, Ce or Ga, or a metal oxide of these metals.

The thickness of each of the transparent electrode layers 41 and 42 are preferably from 40 to 80 nm, more preferably from 50 to 70 nm. The method for forming the transparent electrode layer is not particularly limited, and is preferably a sputtering method or an RPD (radical plasma deposition) method since the method can attain a precise thickness control.

When a transparent electrode is formed in an in-plane edge portion on the emitter layer side (e.g., the side where the silicon layer different in conductivity-type from that of the silicon substrate is located), recombination or leakage is easily caused. It is therefore preferred that an end portion and a peripheral portion of the substrate is covered with a mask during formation of the transparent electrode layer on the emitter layer side. The "peripheral portion" means a region of the substrate that extends over a length of about 300 μm to 1000 μm from the end portion of the substrate. In the meantime, since the non-emitter-layer side (the side where the silicon layer having same conductivity-type to the silicon substrate is arranged) is relatively less affected by the recombination and the leakage, the outputted power is not easily lowered even when the transparent electrode layer is formed on the entire surface on the non-emitter-layer side.

[Collecting Electrode]

A light-receiving-side collecting electrode is formed on the first transparent electrode layer 41 on the light-receiving side, and a back-side collecting electrode is formed on the second transparent electrode layer 42 on the back side. Since the solar cell of the present invention has patterned collecting electrodes on both the light-receiving side and the back side, light is captured from the back side as well.

Figure 2:
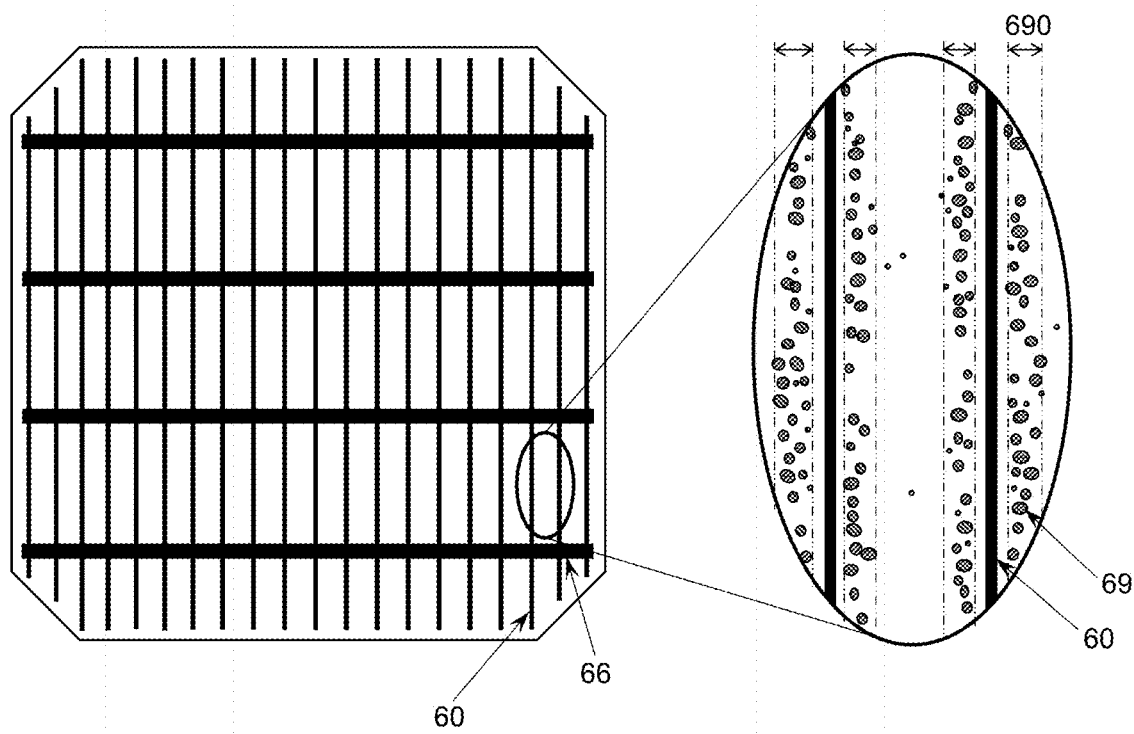
FIG. 2 is a plan view of a light-receiving surface of a solar cell.
Figure 3:
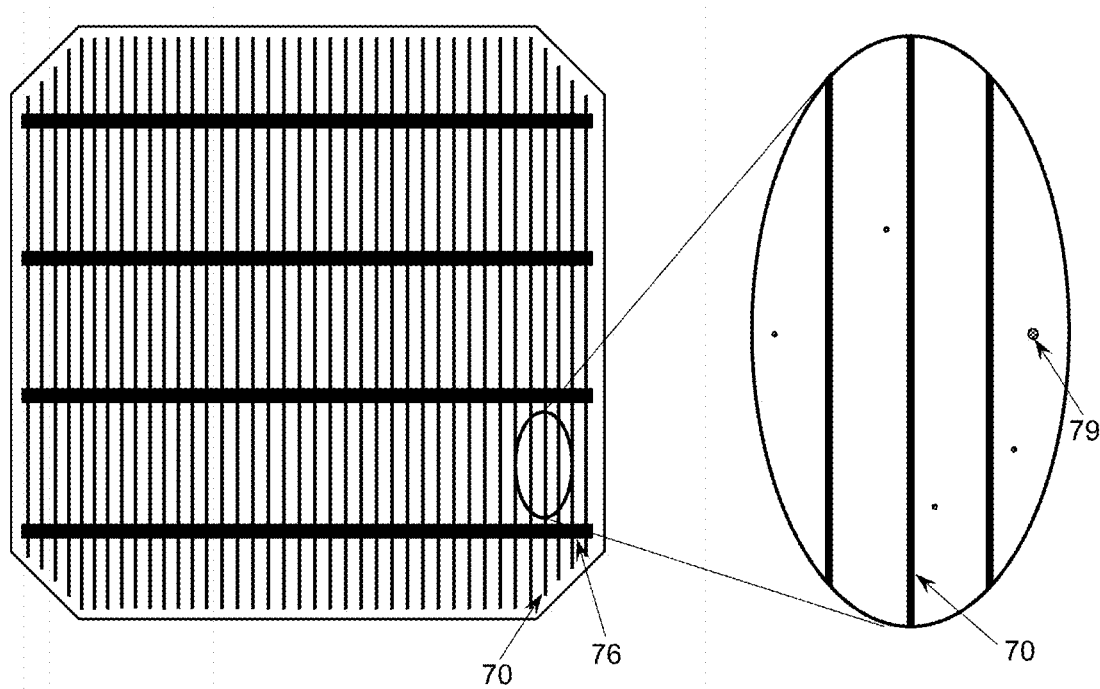
FIG. 3 is a plan view of a back surface of the solar cell.

The light-receiving-side collecting electrode and the back-side collecting electrode each include a plurality of finger electrodes. Respective directions along which the finger electrodes are extended are preferably parallel to each other. FIG. 2 is a plan view of the light-receiving side of the solar cell, and FIG. 3 is a plan view of the back side of the solar cell. A circled portion on the right side of each of FIGS. 2 and 3 is an enlarged view of a vicinity of the finger electrodes.

In the configuration illustrated in FIG. 2, finger electrodes 60 and bus bar electrodes 66 extending orthogonal to the finger electrodes are provided on the light-receiving surface of the photoelectric conversion section. In the configuration illustrated in FIG. 3, finger electrodes 70 and bus bar electrodes 76 extending orthogonal to the finger electrodes are provided on the back surface of the photoelectric conversion section. Carrier collecting efficiency can be improved when bus bar electrodes orthogonal to the finger electrode are provided to form grid shape collecting electrodes as illustrated in each of FIGS. 2 and 3. In addition, electrical connection between the solar cell and wiring members can be facilitated by providing the bus bar electrodes.

Since the amount of light incident from the back side is 10% or less of that from the light-receiving side, shadowing loss caused by the finger electrodes on the back side is less than those on the light-receiving side. It is therefore preferred to design the back-side finger electrodes, prioritizing an improvement of carrier collecting efficiency. It is preferred that the back-side finger electrodes are provided more densely than the light-receiving-side finger electrodes, and a separation distance between the light-receiving-side finger electrodes is greater than that of the back-side finger electrodes. The finger electrode separation distance is a distance between respective center lines of the adjacent two finger electrodes. The separation distance of the light-receiving-side finger electrodes is preferably from 1.5 to 5 times, more preferably from 2 to 4 times greater than that of the back-side finger electrodes.

As illustrated in FIG. 1, the light-receiving-side finger electrode 60 has a plating metal layer 62 on the metal seed layer 61. The metal seed layer 61 is formed between the photoelectric conversion section 50 and an insulating layer 81. The plating metal layer 62 is in conduction with the metal seed layer 61 through the openings 86 formed in the insulating layer 81.

(Metal Seed Layer)

The metal seed layer 61 functions as an underlying layer of the plating metal layer 62. Examples of the metal contained in the metal seed layer include Au, Ag, Ni, Cu, Sn and Al. Among these, Ag, Ni, and Sn are preferred to keep the contact resistance low between the metal seed layer and the surface of the photoelectric conversion section, and to suppress resistivity increase and the like caused by oxidization. A combination of a plurality of metallic materials may be used in order to maintain the reliability of the metal seed layer and simultaneously decrease costs.

The metal seed layer 61 may be formed by, for example, electroless plating, sputtering, vapor deposition, or printing. From the viewpoint of raw material utilization efficiency, the metal seed layer is preferably formed by printing. In formation of the metal seed layer by printing, an electroconductive paste containing metal fine particles, a binder resin material and a solvent is preferably used. The binder resin is preferably a thermosetting resin such as epoxy resin, phenolic resin, or acrylic resin. The resin may be a solid resin or a liquid resin.

(Plating Metal Layer)

The plating metal layer 62 is formed on the metal seed layer 61. In this case, collecting electrode with lower resistance can be formed at lower costs than formation of collecting electrode using only Ag paste. Examples of the metal deposited for the plating metal layer include Sn, Cu, Ag and Ni. Among these, Cu is preferred due to even lower resistance at even lower costs.

Although the plating metal layer 62 may be formed by either electroless plating or electroplating, electroplating is preferred. Electroplating is favorable in view of productivity, since the electroplating can give a large metal deposition rate, and metal deposition thickness can be controlled based on a coulomb amount.

The plating metal layer 62 may be composed of a plurality of layers. For example, formation of a plating metal layer with high electroconductivity, such as Cu, followed by formation of a plating metal layer with excellent chemical stability, such as Sn, may suppress deterioration of the plating layer caused by oxidation etc.

The structure of the back-side finger electrodes 70 is not particularly limited, and is preferably a structure equivalent to that of the light-receiving-side finger electrodes 60, i.e., a plating metal layer 72 is provided on a metal seed layer 71, and the metal seed layer 71 is in conduction with the plating metal layer 72 through openings 87 formed in an insulating layer 82.

The raw materials of the first plating metal layer 62 of the light-receiving-side finger electrodes 60 and the second plating metal layer 72 of the back-side finger electrodes 70 may be same or different from each other. When the respective raw materials of the front side and back side plating metal layers are identical with each other, stresses and thermal expansions on front and back side of the photoelectric conversion section can be made even. In addition, the first plating metal layer 62 on the light-receiving surface and the second plating metal layer 72 on the back surface can be formed simultaneously in a single plating bath, so that the process can be made simple to improve the production efficiency while lowering process costs.

The method for forming the bus bar electrodes 66 and 76 is not particularly limited and is preferably equivalent to the method for forming the finger electrodes 60 and 70, in which a plating metal layer is formed on a metal seed layer. By forming the finger electrodes and the bus bar electrodes through the same method, the process can be made simple to improve the productivity. In addition, since the bus bar electrodes are larger in line width than the finger electrodes, plating metal layers with high in-plane uniformity can be formed by an electroplating with providing electric supply points on the metal seed layers of the bus bar electrodes.

[Insulating Layer]

In the collecting electrode-non-formed region on the light-receiving surface of the photoelectric conversion section, a substantially entire surface is covered with the insulating layer 81. The wording "substantially entire surface" means an area region of 95% or more of the surface. In order to enhance a water-vapor-barrier effect or a hydrogen-elimination-preventing effect of the insulating layer, coverage of the collecting electrode-non-formed region with the insulating layer is preferably 98% or more, more preferably 99% or more. It is also preferred that the substantially entire collecting electrode non-formed region on the back surface of the photoelectric conversion section is covered with the insulating layer 82.

The formation of the first insulating layer 81 of the light-receiving surface and the second insulating layer 82 of the back surface makes it possible to protect the photoelectric conversion section 50 from the plating solution during formation of the first and second plating metal layers 62 and 72. By making the opening 86 and 87 in the insulating layers 81 and 82 on the metal seed layers 61 and 71, the plating metal layers 62 and 72 can be selectively formed on the metal seed layers 61 and 71, respectively. In the present invention, isolated plating metal layer pieces 69 can be formed at specific positions of the light-receiving surface by providing openings 89 in metal seed layer 61-non-formed regions of the first insulating layer 81.

Materials of the insulating layers 81 and 82 are not particularly limited. An inorganic material is preferred since openings can easily be formed and the material may have excellent protecting performance. The inorganic material of the insulating layers may be a metal oxide such as silicon oxide, magnesium oxide, copper oxide, or niobium oxide. The inorganic material of the insulating layers is preferably, for example, SiO, SiN or SiON since the material is easily formed by CVD or printing, and is excellent in transparency. In order to improve light-collection efficiency of the solar cell module, the respective refractive indexes of the insulating layers 81 and 82 are preferably lower than the respective refractive indexes of the outermost layers 41 and 42 of the photoelectric conversion section 50 and higher than the respective refractive indexes of encapsulants 111 and 112.

The thickness of each of the insulating layers 81 and 82 is not particularly limited. In order for these layers to achieve both protectability for the photoelectric conversion section 50 and easiness for making the openings in the layers, the thickness of each of the first insulating layer 81 and the second insulating layer 82 is preferably from 10 to 200 nm, more preferably from 30 to 150 nm.

The insulating layers each made of an inorganic material are high in water vapor barrier performance, so that the layers also have an effect of protecting the transparent electrode layers 41 and 42 formed on the respective surfaces of the photoelectric conversion section 50 from water in the environment. The respective surfaces of the photoelectric conversion section are covered with the inorganic insulating layers 81 and 82, and this can give a solar cell module high in reliability even when a back-side protecting member 130 contains no metal foil. Accordingly, the back-side protecting member 130 containing no metal foil is usable, so that it is possible to improve the conversion efficiency of the solar cell module of an installation type, in which light enters into the module also from the back side thereof, such as a flat roof type or an on-ground installation type.

The method for forming the insulating layers is not particularly limited. When the metal seed layers 61 and 71 are formed by printing an electroconductive paste, the insulating layers 81 and 82 are formed preferably by CVD. As described in WO 2013/077038 (Patent Document 1) above, according to a method of forming a metal seed layer by the screen printing of, e.g., an electroconductive paste, and then forming an inorganic insulating layer made of, e.g., silicon oxide thereon by CVD, the surface shape of the metal seed layer can be changed by heating during or after the film formation by the CVD, so that crack-like openings can be formed in an insulating layer on the metal seed layer. The metal seed layers 61 and 71 exposed to the atmosphere at the bottoms of the openings 86 and 87 in the respective insulating layers 81 and 82 become origination points for plating, so that the plating metal layers 62 and 72 can be selectively formed on the metal seed layer-formed regions.

[Isolated Plating Metal Layer Piece]

The solar cell of the invention has isolated plating metal layer pieces 69 which do not contact any finger electrode on the surface of the first insulating layer 81 of the light-receiving surface. The isolated plating metal layer pieces are not in conduction with any finger electrode, and thus do not contribute to extracting photocarriers in the solar cell. Light near the surface of the solar cell is reflected and scattered to change propagation direction largely due to the isolated plating metal layer piece. Each of the isolated plating metal layer pieces preferably has a substantially circular shape with a projection area diameter of 0.1 µm to 10 µm.

As schematically illustrated by the circulated enlarged view in FIG. 2, the isolated plating metal layer pieces 69 of the light-receiving surface are formed to be unevenly distributed into the form of bands parallel to the extending direction of the light-receiving-side finger electrodes 60, so that isolated plating metal crowded regions 690 are formed. Each of the isolated plating metal crowded regions is a region in which the area density of the isolated plating metal layer pieces is higher than the average area density of the entire isolated plating metal layer pieces in the entire region where the light-receiving-side finger electrodes are not formed. In the isolated plating metal layer pieces crowded regions, the isolated plating metal layer pieces are formed at an area density two or more times more than the average area density in the entire region of the light-receiving surface. The area density of the isolated plating metal layer pieces is obtained by dividing the light-receiving surface into regions which are each a region 10 µm square (100 µm$^2$), and calculating out the area of the isolated plating metal layer pieces in each of these regions.

The width of each of the isolated plating metal crowded regions 690 is preferably 300 µm or less, more preferably 200 µm or less. The lower limit of the width of the isolated plating metal crowded region 690 is not particularly limited. The isolated plating metal layer pieces may be arranged in one straight line. The isolated plating metal crowded region need not to be linked with each other over the whole of the region along the light-receiving-side finger electrode 60 extends. Thus, the isolated plating metal crowded regions may partially have one or more interruptions. The isolated plating metal crowded regions do not need to be present in completely parallel to the light-receiving-side finger electrodes 60. Thus, the solar cell may have sites where the regions are meandering to the light-receiving-side finger electrode-extending direction.

When the isolated plating metal layer pieces 69 are located to be unevenly distributed in regions in the form of bands parallel to the light-receiving-side finger electrode 60-extending direction, the current density of the solar cell tends to be improved. Although the isolated plating metal layer pieces deposited on the light-receiving surface enlarge the light-shielding area, current density increases. The reason for this is considered to be that sunlight (parallel light rays) incident to the light-receiving-side finger electrodes is reflected on the isolated plating metal layer pieces so that the quantity of light entering into the photoelectric conversion section is increased. Light incident to the finger electrodes is reflected into a direction parallel to the light-receiving surface, or is regularly reflected in the light incident direction. The light reflected into the light incident direction may be again reflected on the interface between a surface protecting layer (e.g., a glass plate) to enter into the photoelectric conversion section, whereas reflected light in the direction parallel to the light-receiving surface, in general, hardly enters into the photoelectric conversion section. On the other hand, when the isolated plating metal layer pieces 69 are formed near the light-receiving-side finger electrodes 60, the light reflected, on the finger electrodes, into the direction parallel to the light-receiving surface may be reflected on the isolated plating metal layer pieces. Therefore, amount of light taken into the photoelectric conversion section 50 would be increased.

It is preferred the isolated plating metal crowded regions 690 of the light-receiving surface are present 20 µm or more away from the edge of each of the light-receiving-side finger electrodes. If the distance between the isolated plating metal layer piece 69 and the light-receiving-side finger electrodes 60 is too small, such a proportion that light scattered and reflected on the isolated plating metal layer piece again reaches the light-receiving-side finger electrode becomes large, and therefore the quantity of reflected light that can be taken into the photoelectric conversion section 50 tends to decrease. On the other hand, if the distance between the isolated plating metal layer pieces 69 and the light-receiving-side finger electrodes 60 is too large, such a proportion that light reflected on the light-receiving-side finger electrode reaches the isolated plating metal layer piece becomes small, and therefore the proportion of reflected light which is to be reflected into the atmosphere tends to increase. For this reason, the distance (separation distance) between the light-receiving-side finger electrodes 60 and the isolated plating metal crowded regions 690 is preferably 200 μm or less. The distance between the light-receiving-side finger electrode 60 and the isolated plating metal crowded region 690 is more preferably from 30 μm to 150 μm, further preferably from 40 μm to 100 μm.

As schematically illustrated in the circled enlarged view in FIG. 3, isolated plating metal layer pieces 79 may be formed also on the surface of the second insulating layer 82 on the back side. Almost all of light that enters from the back side of the solar cell is near infrared rays transmitted to the back side without being absorbed in the photoelectric conversion section, and re-incident rays obtained in such a manner that light incident to gaps between solar cells arranged adjacently is reflected; and thus is non-parallel rays. Therefore, re-incidence effect by scattering and reflection like on the light-receiving side cannot be expected on the back side, even when the isolated plating metal layer pieces are formed. In the meantime, light incident to the isolated plating metal layer pieces may cause shadowing loss. Accordingly, an increase in the area where the isolated plating metal layer pieces are deposited on the second insulating layer 82 on the back side may reduce the reflected light capturing efficiency from the back surface. It is therefore preferred that the area density of isolated plating metal layer pieces 69 on the surface of the first insulating layer 81 on the light-receiving side is larger the area density of isolated plating metal layer pieces 79 on the surface of the second insulating layer 82 on the back side. The area density of the isolated plating metal layer pieces on the surface of the first insulating layer on the light-receiving side is preferably 1.2 times or more, more preferably 1.5 times or more, further preferably 2 times or more than the area density of the isolated plating metal layer pieces on the surface of the second insulating layer. With respect to the area density of the isolated plating metal layer pieces in a range 250 μm or less apart from the edge of each of the finger electrodes, the area density on the light-receiving side is preferably 2 times or more, more preferably 5 times or more, further preferably 8 times or more than the area density of the isolated plating metal layer pieces on the back side.

The method for forming the isolated plating metal layer pieces is not particularly limited. The pieces are preferably formed by a plating method at the same time of forming the plating metal layer 62 of the finger electrodes 60. It is therefore preferred that the material of the isolated plating metal layer pieces 69 is identical to the material of the plating metal layer 62. When the plating metal layer 62 contains copper, it is preferred that the isolated plating metal layer pieces 69 also contain copper.

After making openings 89 in the insulating layer 81 on the metal seed layer 61-non-formed regions, the plating metal layer 62 and the isolated plating metal layer pieces 69 can be simultaneously formed by depositing plating metal on the transparent electrode layer 41 exposed under the openings as an origination point of plating. By forming the openings 89 along a direction parallel to the metal seed layer 61-extending direction, the isolated plating metal layer pieces 69 can be formed, which are unevenly distributed in the form of band-shape extending parallel to the finger electrode 60-extending direction.

The method for making the openings 89 in the insulating layer 81 on the metal seed layer-non-formed regions is not particularly limited. The openings 89 can be made by, e.g., laser scribing, or a mechanical method such as mechanical scribing. The openings 89 can be made into the form of pinholes in the insulating layer 81 by bringing a brush made of resin into contact with the surface of the photoelectric conversion section 50 (transparent electrode layer 41) to generate fine particles before forming the insulating layer 81, then forming the insulating layer 81 thereon. Methods of pressing a porous resin sheet or roller or blowing grains on the surface of the photoelectric conversion section may also generate particles on the surface of the photoelectric conversion section so that the openings 89 can be formed in the insulating layer 81.

In a preferred embodiment, the openings 89 are formed in the insulating layer 81 on the metal seed layer-non-formed regions without scratching the surface of the photoelectric conversion section. The openings 89 can be formed by using the ooze of solvent in the electroconductive paste used in formation of the metal seed layer 61. In general, the thixotropy of an electroconductive paste is designed in such a manner that electroconductive fine particles and binder resin do not ooze out from the printed regions even when a large printing pressure is applied. However, as the printing pressure is increased, the ooze amount of the solvent tends to increase. Solvent oozed out from the electroconductive paste-formed regions (printed regions) volatilizes when heated in solidifying the paste. When an insulating layer is formed on the region where the solvent has been oozed, pinholes tend to be easily made near outer peripheral of the solvent oozing regions. By depositing a plating metal, using the pinholes 89 as origination points, the isolated plating metal crowded regions 690 can be formed in band-shape extending parallel to the light-receiving-side finger electrode 60-extending direction.

In order to form the isolated plating metal layer pieces 69 on the on the light-receiving side in a band-shape parallel to the light-receiving-side finger electrode 60-extending direction and for suppressing the formation of isolated plating metal layer pieces on the back side, it is sufficient that the printing pressure to the electroconductive paste is made larger when the first metal seed layer 61 is formed on the light-receiving surface, than that to the electroconductive paste when the second metal seed layer 71 is formed on the back surface.

By increasing the printing pressure to the electroconductive paste on the light-receiving side, the solvent in the paste is oozed out to make pinholes in the first insulating layer 81. By reducing the printing pressure to the electroconductive paste on the back side, the ooze of the solvent is restrained to suppress generation of pinholes in the second insulating layer 82. By this way, the isolated plating metal layer pieces 69 can be selectively formed on the light-receiving side, even when the first plating metal layer 62 on the light-receiving surface and the second plating metal layer 72 on the back surface are deposited under the same plating conditions.

As described above, in a case where an interval of the light-receiving-side finger electrodes 60 is larger than that of the back-side finger electrodes 70 and thus the finger electrodes on the back side are formed more densely, a screen plate having larger aperture area ratio may be used for printing an electroconductive paste on the back side. Accordingly, in the case of forming the first metal seed layer on the light-receiving surface and the second metal seed layer on the back surface under the same printing conditions, the printing pressure on the light-receiving side becomes relatively larger than that of on the back side.

[Examples of Application to Solar Cells Other than Heterojunction Solar Cell]

In the above, the structure of the solar cell of the present invention was described with the use of mainly the example of the heterojunction solar cell in which the photoelectric conversion section 50 includes conductive silicon-based thin-films 31 and 32 and transparent electrode layers 41 and 42 on both the surfaces of the conductive single-crystalline silicon substrate 10. The invention is applicable to solar cells other than heterojunction solar cells. Specific examples of the other solar cells include a crystalline silicon solar cells other the heterojunction type, a solar cell including a semiconductor substrate other silicon such as GaAs, a silicon-based thin-film solar cell in which a transparent electrode layer is formed on a pin junction or pn junction of an amorphous silicon-based thin-film or crystalline silicon silicon-based thin-film, compound semiconductor solar cell such as CIS or CIGS, an organic thin-film solar cell such as dye sensitizing solar cell and one using an organic thin-film (electroconductive polymer).

[Solar Cell Module]

Figure 4:
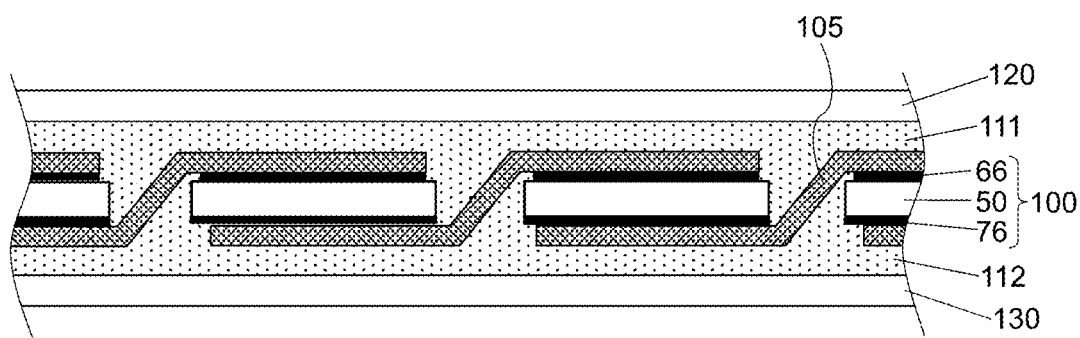
FIG. 4 is a schematic sectional view of a solar cell module of one embodiment.

The solar cells of the present invention are preferably modularized when put into practical use. In order to modularize the solar cells, an appropriate method is used. For example, as illustrated in FIG. 4, respective bus bar electrodes 66 and 76 of solar cells 100 are connected to each other through wiring members 105 to form a solar cell string in which a plurality of the solar cells are connected to each other in series or in parallel. The solar cell string is encapsulated with encapsulants 111 and 112, and protecting members 120 and 130 to modularize the solar cells. The solar cells can be electrically connected to the wiring members by, for example, solder connection using a low-melting-point solder, or connection based on compression using a conductive film (CF).

Transparent resins are suitable for the encapsulant. Examples thereof include ethylene/vinyl acetate copolymer (EVA), ethylene/vinyl acetate/triallyl isocyanurate (EVAT), polyvinyl butyrate (PVB), silicone, urethane, acrylic, epoxy and olefin resins. In order to decrease costs, the use of EVA is preferred for the light-receiving side encapsulant 111. When the back-side protecting member 130 containing no metal foil is used, it is preferred to use a polyolefin-containing back side encapsulant as the member 112 for improving reliability of module. Since polyolefin resin has a low water permeability, water can be restrained from invading the photoelectric conversion sections even when the back-side protecting member containing no metal foil is used.

It is preferred that the refractive index $n_1$ of the back side encapsulant, the refractive index $n_2$ of the second insulating layer and the refractive index $n_3$ of the outermost layer on the back side of the photoelectric conversion section 50 satisfy the relation: $n_1<n_2<n_3$. When the refractive index increases step by step from the back side toward the photoelectric conversion section, reflected light on the back side is taken into the photoelectric conversion sections even more, so that the module conversion efficiency can be enhanced. In the above-mentioned heterojunction solar cell, the outermost layer of the photoelectric conversion section 50 on the back side is the second transparent electrode layer 42. Therefore, it is sufficient that silicon oxide or any other material having lower refractive index than the transparent electrode is used for the second insulating layer, and a material having even lower refractive index is used for the back side encapsulant. Since the refractive index of the encapsulant is generally about 1.5, and that of the transparent electrode is about 1.9 to 2.3, the insulating layer preferably has a refractive index in a range from 1.5 to 2.3. The refractive index is a value at a wavelength of 600 nm, and is measured by using an ellipsometer.

Examples of the material used for the light-receiving-side protecting member 120 include, for example, a glass plate (blue glass plate or white glass plate), a fluororesin film such as a polyvinyl fluoride film (for example, a TEDLAR film (registered trademark), or a polyethylene terephthalate (PET) film. From the viewpoint of mechanical strength, optical transmittance, water blocking performance, costs and others, a glass plate is preferred and a white glass plate is particularly preferred.

The back-side protecting member 130 may be a glass plate, a resin film, a metal foil piece made of aluminum, or a stack body of two or more of these members. Since the solar cell of the present invention has a patterned collecting electrode on the back side, the back-side protecting member 130 with optical transparency enables the cell to capture light also from the back side. Therefore, in a solar cell module of an installation type, in which light enters from the back side, such as a flat roof type or on-ground installation type, it is preferred to use the back-side protecting member 130 having optical transparency and containing no metal foil.

When the back-side protecting member contains no metal foil, the invasion of water from the back side tends to increase. In the solar cell of the present invention, both the front and back surfaces of the photoelectric conversion section are covered with insulating layers. Therefore, water invasion into the photoelectric conversion sections can be prevented even when the back-side protecting member contains no metal foil.

In one embodiment, a layer stack in which a black resin layer and an infrared reflection layer are stacked from the solar cell side is used as the back-side protecting member 130. The black resin layer has visible ray absorbance and absorbs visible rays having wavelengths of 800 nm or less. The visible ray transmittance of the black resin layer is preferably 10% or less. The use of the back-side protecting member including the black resin layer gives a solar cell module in which a gap between adjacent two solar cells is nonconscious to show a high design property since the solar cells are close in external appearance color to the back-side protecting member.

By arranging the infrared reflection layer on the back side of the black resin layer, it is possible to reflect light incident to the gap between adjacent two solar cells, and near infrared ray transmitted through the back side without being absorbed in the photoelectric conversion section. The reflected light can be re-entered into the solar cell, so that the module conversion efficiency can be improved. In the infrared reflection layer, the reflectivity of near infrared rays having wavelengths of 800 nm to 1200 nm is preferably 80% or more, more preferably 85% or more, even more preferably 90% or more. In order to radiate the near infrared rays reflected on the infrared reflection layer again into the solar cell, the transmittance of infrared rays having wavelengths of 800 nm to 1200 nm in the black resin layer is preferably 80% or more.

For the black resin layer, a resin composition is preferably used which contains a colorant such as a pigment or dye, and a thermoplastic resin such as polyolefin resin, polyester resin, acrylic resin, fluororesin, or ethylene/vinyl acetate resin. The coloring agent is preferably a material absorbing visible rays and transmitting near infrared rays and may be, for example, a combination of three or more colorants which are different from one another in color hue and each have a lightness L* of 45 or more, or a dark-color organic pigment. The black resin layer may contain an inorganic pigment having an infrared reflective property.

The infrared reflection layer may be, for example, a resin layer made of a resin composition containing titanium oxide or any other white pigment having an infrared reflective property, or an infrared reflective metal foil (for example, an aluminum or silver). The metal foil may be corroded or cause short-circuited by exposing to the air. It is therefore preferred to use a resin layer containing no metal foil as the infrared reflection layer, from the viewpoint of improving reliability and safety of the module. For bonding the black resin layer and the infrared reflection layer, an adhesive layer may be interposed therebetween.

EXAMPLES

Hereinafter, the present invention will be described in detail by showing examples, but the present invention is not limited to the following examples.

Example 1

(Texture Formation on Silicon Substrate Surface)

An n-type single-crystalline silicon substrate having a light receiving surface with a (100) plane orientation and having a thickness of 200 μm was washed in acetone, immersed in a 2 wt % HF aqueous solution for 5 minutes to remove a silicon oxide layer on a surface, and rinsed twice with ultra-pure water. Washed silicon substrate was immersed for 15 minutes in a 5/15 wt % KOH/isopropyl alcohol aqueous solution held at 75° C. to perform anisotropic etching. Thereafter, the substrate was immersed in a 2 wt % BF aqueous solution for 5 minutes, rinsed twice with ultra-pure water, and then dried at ambient temperature. Surfaces of the silicon substrate were observed with an AFM to confirm that quadrangular pyramid-like textured structures having an exposed (111) surface were formed on each of the front and back surfaces The arithmetic mean roughness thereof was 2100 nm.

(Formation of Silicon-Based Thin-Films)

The texture-formed single-crystalline silicon substrate was introduced into a CVD apparatus, on the light-receiving surface thereof, an intrinsic amorphous silicon layer was deposited to have a thickness of 4 nm and a p-type amorphous silicon layer was deposited thereon to have a thickness of 5 nm. The thickness of the thin-film in this example is a value calculated from a deposition rate determined by measuring the thickness of a thin-film formed on a glass substrate under the same conditions using a spectroscopic ellipsometer (trade name: M2000, manufactured by J.A. Woollam Co. Inc.).

Deposition conditions of the intrinsic amorphous silicon layer included a substrate temperature of 180° C., a pressure of 130 Pa, a $SiH_4/H_2$ flow ratio of 2/10 and a supplied power density of 0.03 W/cm$^2$. Deposition conditions of the p-type amorphous silicon layer included a substrate temperature of 190° C., a pressure of 130 Pa, a $SiH_4/H_2/B_2H_6$ flow ratio of 1/10/3 and a supplied power density of 0.04 W/cm$^2$. With respect to the $B2H_6$ gas mentioned above, a diluting gas wherein $B_2H_6$ was diluted with 112 gas to have a concentration of 5000 ppm was used.

Thereafter, on the back surface of the silicon substrate an intrinsic amorphous silicon layer was deposited to have a thickness of 5 nm. On the intrinsic amorphous silicon layer, an n-type amorphous silicon layer was deposited to have a thickness of 10 nm. Deposition conditions of the n-type amorphous silicon layer included a substrate temperature of 180° C., a pressure of 60 Pa, a $SiH_4/PH_3$ flow ratio of 1/2 and a supplied power density of 0.02 W/cm$^2$. With respect to the $PH_3$ gas mentioned above, a diluting gas wherein $PH_3$ was diluted with 112 gas to have a concentration of 5000 ppm was used.

(Deposition of Transparent Electrode Layers)

The substrate on which the silicon-based thin-films were formed was transferred to an RPD apparatus, and an 80 nm-thick indium oxide layer was formed as a transparent electrode layer on each of the p-type amorphous silicon layer and the n-type amorphous silicon layer. 1% tungsten doped $In_2O_3$ was used as a vapor deposition source. In deposition of the transparent electrode layer on the light-receiving side (on the p-type amorphous silicon layer), a peripheral region 0.5 to 0.75 mm from the edge was covered with a mask to avoid deposition of indium oxide layer on the peripheral portion. In deposition of the transparent electrode layer on the back side (on the n-type amorphous silicon layer), no mask was used to deposit the indium oxide layer on the whole of the surface.

(Formation of Metal Seed Layers)

An electroconductive paste was screen-printed on the indium oxide layer on the light-receiving side to form metal seeds. A paste used for formation of the metal seeds on the light-receiving side included: SnBi metal powder (particle size $D_L$=25 to 35 μm; and melting point $T_1$=141° C.) and silver powder (particle size $D_H$=2 to 3 μm; and melting point $T_2$=971° C.) at a ratio by mass of 20/80 as electroconductive fine particles; an epoxy resin (5 wt %) as a binder resin; and a solvent. This electroconductive paste was screen-printed on the substrate, using a screen plate having openings corresponding to a pattern of bus bar electrodes and finger electrodes (finger electrode width: 70 μm; and finger electrode pitch: 2 mm), and then the resultant was temporarily baked at 140° C. for about 20 minutes.

Next, in the same manner as on the light-receiving side, the electroconductive paste was printed on the indium oxide layer on the back side, and the resultant was temporarily baked to form metal seeds. For formation of the metal seeds on the back side, a screen plate having printing openings corresponding to a finger electrode width of 60 μm and a finger electrode pitch of 0.75 mm was used.

The surfaces of the substrate on which the metal seeds were formed were observed with an optical microscope. On the light-receiving side, volatilization traces of the solvent in the electroconductive paste in the printing were observed in a region over lengths of 50 to 200 μm from the end of the metal seeds. On the back side, no volatilization traces were observed.

(Formation of Insulating Layers)

The substrate was transferred to a CVD apparatus, and a 40 nm-thick silicon oxide layer was deposited on the light-receiving surface. Thereafter, the substrate was turned upside down, and a 60 nm-thick silicon oxide layer was formed on the back surface. Deposition conditions of the silicon oxide included a substrate temperature of 180° C., a pressure of 60 Pa, a $SiH_4/CO_2$ flow ratio of 1/10 and a supplied power density of 0.04 W/cm$^2$. After formation of the silicon oxide layer on the back side, the insulating layer on the light-receiving side had a thickness of 40 nm at a central portion and 60 nm at a peripheral portion. The thickness at the peripheral portion was increased.

Surface shape change due to thermal-fluidization of the metallic material in the metal seeds and degassing from the metal seeds occur by the heating during formation of the silicon oxide layer, and thereby many pinholes were formed in the silicon oxide layers deposited on the metal seeds. On the light-receiving side, pinholes were also formed located peripheral of volatilization traces of the solvent in the paste.

(Formation of Plating Metal Layers)

A probe was connected to the metal seeds in bus bar regions on each of the light-receiving side and the back side. The substrate was immersed in a copper plating solution to perform electroplating, so that a copper plating layer was deposited to have a thickness of about 10 μm on the metal seeds. The substrate was rinsed with pure water, and then was immersed in a tin plating solution to perform electroplating. A tin plating layer was deposited to have a thickness of about 3 μm on each of outer surfaces of the copper layers. Thereafter, the substrate was rinsed with pure water. In this way, on each of the light-receiving side and the back side, a plating metal layer consisting of a stack of the copper plating layer and the tin plating layer was formed onto the seed metal layer.

Figure 5:
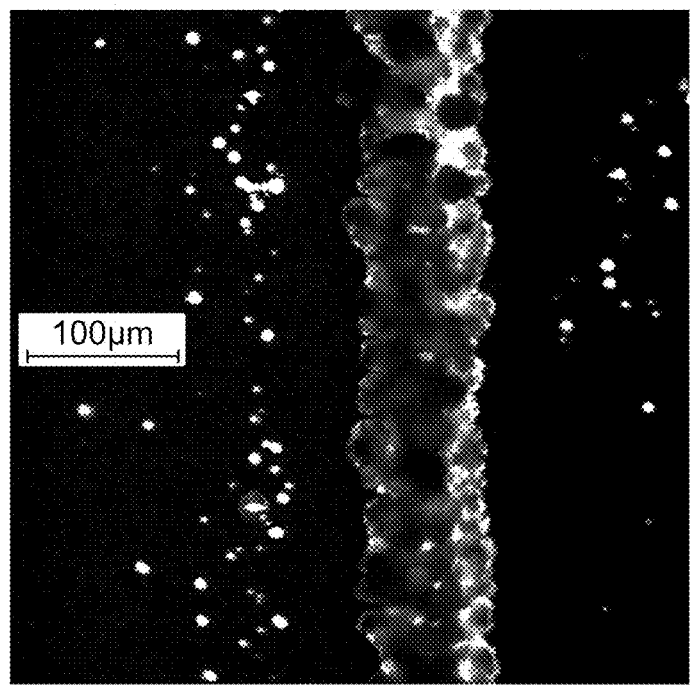
FIG. 5 is a microscope-observed photograph of a light-receiving surface of a solar cell of an example.
Figure 6:
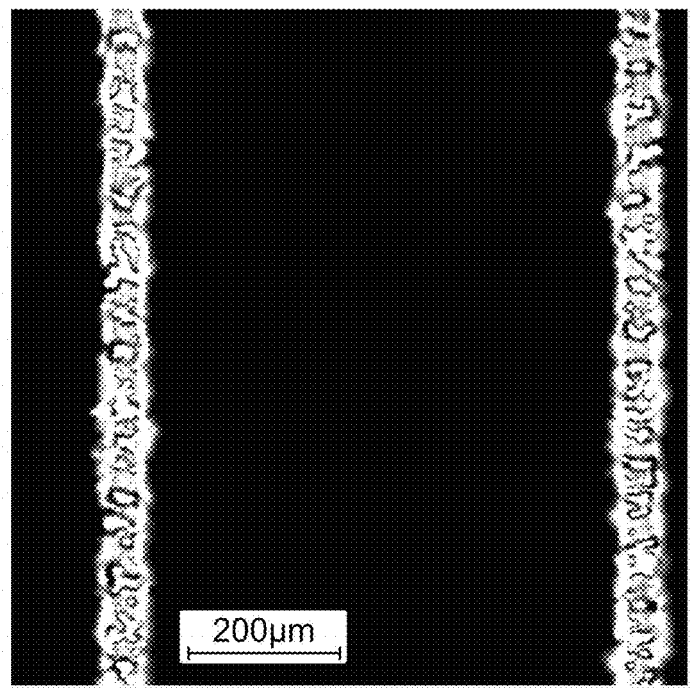
FIG. 6 is a microscope-observed photograph of a back surface of the solar cell of the example.

Surfaces after the electroplating were observed with an optical microscope. FIGS. 5 and 6 show microscope observation images of the light-receiving surface and back surface, respectively. On the light-receiving side, in regions 50 to 200 μm apart from the end of the metal seed layer, many isolated plating metal layer pieces each having a diameter of about 1 to 10 μm were deposited to form isolated plating metal crowded regions. On the back side, isolated plating metal layer pieces were formed at random, but no isolated plating metal crowded regions were formed.

(Modularization)

Four solar cells obtained above were used to produce a mini-module. Initially, light-receiving side bus bars and the back side bus bars of adjacent two solar cells were connected via tab connector using a solder to obtain a solar cell string in which the four solar cells were connected to one another in series. EVA resin sheets as encapsulants were arranged on the light-receiving side and the back side of the solar cell string. A strengthened white glass piece as a light-receiving-side protecting member and a transparent resin sheet containing a tetrafluoroethylene/ethylene copolymer (ETFE) resin as a back-side protecting member were arranged thereon. The resultant was subjected to vacuum drawing, and then heated at 150° C. for about 30 minutes to cause the EVA to undergo crosslinking reaction. In this way, the string was encapsulated.

Comparative Example 1

In the same manner as in Example 1, solar cells and a mini-module were produced except that, in formation of the light-receiving side metal seed layer, the printing pressure for the screen printing was made small to restrain the solvent in the electroconductive paste from oozing. After formation of the metal seed layers, surfaces of the substrate were observed with an optical microscope to confirm that no volatilization traces were formed on each of the light-receiving side and the back side. The surfaces after the electroplating were observed with an optical microscope to confirm, on each of the light-receiving side and the back side, formation of isolated plating metal layer pieces at random but isolated plating metal crowded regions were not formed.

Comparative Example 2

In the same manner as in Example 1, solar cells and a mini-module were produced except the followings: the printing pressure for the screen printing was made small to restrain the solvent in the electroconductive paste from oozing in formation of the light-receiving side metal seed layer; and the printing pressure for the screen printing was made large to ooze the solvent in the electroconductive paste in formation of the back side metal seed layer. After formation of the metal seed layers, surfaces of the substrate were observed with an optical microscope to confirm that no volatilization traces were formed on the light-receiving side, and that vaporization traces of the solvent were formed in regions over lengths of 50 to 300 μm from ends of the metal seeds. The surfaces after the electroplating were observed with an optical microscope. On the light-receiving side, isolated plating metal layer pieces were formed at random, but no isolated plating metal crowded regions were formed. On the back side, in regions 50 to 300 μm apart from ends of the metal seeds, many isolated plating metal layer pieces each having a diameter of about 1 to 10 μm were deposited to form isolated plating metal crowded regions.

[Evaluation]

I-V measurement of the mini-module obtained in each of the Example and the Comparative Examples was carried out with using a solar simulator having a light reflective metal on the back side. Short circuit current density (Jsc), open circuit voltage (Voc), fill factor (FF) and conversion efficiency (Elf) are shown in Table 1. In Table 1, each of the conversion characteristics are shown as a relative value with the values of the mini-module of

TABLE 1

| | Jsc | Voc | FF | Eff |
|---|---|---|---|---|
| Example 1 | 1.005 | 1.000 | 1.000 | 1.005 |
| Comparative Example 1 | 1 | 1 | 1 | 1 |
| Comparative Example 2 | 0.998 | 1.000 | 1.000 | 0.998 |

In Comparative Example 2, in which the isolated plating metal layer pieces were disposed near the finger electrodes on the back side, Jsc was lower than in Comparative Example 1, which had no isolated plating metal crowded regions. It can be considered that this result was caused by the fact that Comparative Example 2 was increased in light shielding area by the isolated plating metal layer pieces on the back side, so that amount of captured light from the back side was decreased. In the meantime, in Example 1, in which the isolated plating metal layer pieces were disposed which were crowded in the band shape area near the finger electrodes on the light-receiving side, Jsc became larger than in Comparative Example 1 although Example 1 was large in metal layer-formed area on the light-receiving surface. It can be considered that this result was caused by the fact that sunlight (parallel rays) was reflected on the finger electrodes on the light-receiving side, and then reflected on the isolated plating metal layer pieces to increase the amount of light entering into the photoelectric conversion section.

DESCRIPTION OF REFERENCE CHARACTERS

10: silicon substrate
21, 22: intrinsic silicon-based thin-film 31, 32: conductive silicon-based thin-film
41, 42: transparent electrode layer
50: photoelectric conversion section
81, 82: insulating layer
60, 70: finger electrode
61, 71: metal seed layer
62, 72: plating metal layer
69: isolated plating metal layer piece
690: isolated plating metal crowded region
100: solar cell
105: wiring member
111, 112: encapsulant
120, 130: protecting member

The invention claimed is:

1. A method for manufacturing a solar cell, the method comprising:
   printing an electroconductive paste on a light-receiving surface of a photoelectric conversion section to form a first metal seed layer extending in a first direction, the electroconductive paste including electroconductive fine particles, a resin material, and a solvent;
   oozing the solvent out from a region where the electroconductive paste is printed, forming a solvent oozed region on a light receiving surface of the photoelectric conversion section;
   forming a first insulating layer over the light-receiving surface of the photoelectric conversion section, the solvent oozed region, and the first metal seed layer;
   forming openings in the first insulating layer, exposing surfaces of the first metal seed layer; and
   forming a first plating metal layer on the exposed surfaces of the first metal seed layer by a plating method through the openings formed in the first insulating layer,
   wherein
   during formation of the first plating metal layer by the plating method, a plurality of isolated plating metal layer pieces each of which is isolated from the first plating metal layer are deposited on the first insulating layer,
   wherein the plurality of isolated plating metal layer pieces are deposited densely at a first isolated plating metal crowded region,
   the first isolated plating metal crowded region is a band shaped region extending in the first direction, and is located 20 μm or more and 200 μm or less away from the first plating metal layer in a direction perpendicular to the first direction, and
   the first isolated plating metal crowded region overlaps a peripheral edge of the solvent oozed region, and the first metal seed layer is not provided under the first isolated plating metal crowded region.

2. The method according to claim 1, further comprising:
   forming a second metal seed layer on a back surface of the photoelectric conversion section by printing the electroconductive paste on the back surface of the photoelectric conversion section,
   forming a second insulating layer on the back surface of the photoelectric conversion section and the second metal seed layer,
   forming openings in the second insulating layer, exposing surfaces of the second metal seed layer, and
   forming a second plating metal layer on the exposed surfaces of the second metal seed layer by a plating method through the openings formed in the second insulating layer,
   wherein a printing pressure for printing the electroconductive paste to form the first metal seed layer is larger than a printing pressure for printing the electroconductive paste to form the second metal seed layer.

3. The method according to claim 2, wherein the first plating metal layer and the second plating metal layer are formed simultaneously.

4. The method according to claim 1, wherein an area density of the plurality of isolated plating metal layer pieces included in the first isolated plating metal crowded region is two times or more than an average area density of the plurality of isolated plating metal layer pieces over an entirety of a region over the first insulating layer free from having the first plating metal layer.

5. The method according to claim 1, wherein the plurality of isolated plating metal layer pieces each has a substantially circular shape and each has a diameter less than a width of the first plating metal layer.

6. The method according to claim 1, wherein the first isolated plating metal crowded region includes 20 or more of the first isolated plating metal layer pieces, and the plurality of first isolated plating metal layer pieces are distributed over the entire first isolated plating metal crowded region.

7. The method according to claim 1, wherein
   a plurality of pinholes are formed in the first insulating layer on the peripheral edge of the solvent oozed region, and
   the plurality of isolated plating metal layer pieces are deposited on the plurality of pinholes.

8. The method according to claim 1, wherein the first insulating layer is an inorganic layer having a thickness of 10 to 200 nm.

9. The method according to claim 1, wherein the first plating metal layer and the first isolated plating metal layer pieces each contain copper.

10. The method according to claim 1, wherein
    the photoelectric conversion section includes:
       a conductive single-crystalline silicon substrate having a first surface and a second surface opposite the first surface;
       a first silicon based thin-film having a first conductivity-type over the first surface of the conductive single-crystalline silicon substrate;
       a first transparent electrode layer over the first surface of the conductive single-crystalline silicon substrate;
       a second silicon based thin-film having a second conductivity-type on a second surface side of the conductive single-crystalline silicon substrate; and
       a second transparent electrode layer on the second surface side of the conductive single-crystalline silicon substrate.

* * * * *